(12) United States Patent
Stevens

(10) Patent No.: US 6,551,044 B1
(45) Date of Patent: Apr. 22, 2003

(54) BELLOWS ISOLATION FOR INDEX PLATFORMS

(75) Inventor: Ronald R. Stevens, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/395,795

(22) Filed: Sep. 14, 1999

(51) Int. Cl.⁷ ............................................. B65G 49/07
(52) U.S. Cl. .................... 414/217; 414/217.1; 414/221; 414/939
(58) Field of Search ............................ 414/217, 217.1, 414/221, 939

(56) References Cited

U.S. PATENT DOCUMENTS

| | | | |
|---|---|---|---|
| 4,616,683 A | * 10/1986 | Tullis et al. ................ | 141/98 |
| 5,484,483 A | 1/1996 | Kyogoku | |
| 5,769,184 A | 6/1998 | Hofmeister | |
| 5,833,426 A | 11/1998 | Marohl | |
| 6,032,419 A | * 3/2000 | Hurwitt ..................... | 49/475.1 |
| 6,042,372 A | * 3/2000 | Sakata et al. ............... | 432/241 |
| 6,048,154 A | * 4/2000 | Wytman ..................... | 414/217 |

* cited by examiner

Primary Examiner—Steven A. Bratlie
(74) Attorney, Agent, or Firm—Knobbe, Martens, Olson & Bear, LLP

(57) ABSTRACT

A loadlock chamber for a semiconductor processing apparatus comprises an index platform or registration plate, a shaft extending through a wall of the chamber to actuate the platform, and a bellows located on the outside of the chamber to isolate the shaft from the external environment. A seal is placed between the bottom of the registration plate and the wall of the chamber so as to isolate the space under the registration plate and within the bellows from the remainder of the chamber when the platform is in a fully lowered position. A gutter is formed in a wall of the chamber below the registration plate to catch particulate matter, such as broken wafer particles. A method of accessing the interior of a loadlock chamber limits exposure of the space within the bellows to the external environment.

16 Claims, 5 Drawing Sheets

BELLOWS ISOLATION FOR INDEX PLATFORMS

BACKGROUND OF THE INVENTION

1. Field of the Invention

The present invention relates to semiconductor processing equipment. More particularly the present invention relates to isolating one portion of a load chamber from exposure to the surrounding atmosphere when another portion of the load chamber is exposed to the surrounding atmosphere.

2. Description of the Related Art

The processing of silicon wafer substrates in the production of VLSI chips requires an extremely clean environment. Particulate matter, vapor, or impurities that are invisible to the naked eye can substantially decrease production yields if such impurities contact the surface of a substrate during processing. Processing device chambers are designed to control the environment immediately around the wafer substrate and to maintain strict tolerances for cleanliness. Typically, the first chamber in a processing device is an input/output chamber commonly known as the loadlock chamber. The loadlock chamber introduces substrates into the device in a manner that exposes minimal volume and internal surface area to the outside environment. The present invention provides an improved loadlock chamber that results in a decreased exposure of internal surface area to the outside environment.

SUMMARY OF THE INVENTION

In one aspect of the present invention, a loadlock chamber for a semiconductor processing apparatus comprises an index platform or registration plate, a shaft extending through a wall of the chamber to actuate the platform, and a bellows located on the outside of the chamber to isolate the shaft from the external environment. A seal is placed between the bottom of the registration plate and the wall of the chamber so as to isolate the space under the registration plate and within the bellows from the remainder of the chamber when the platform is in a fully lowered position. In this manner, the remainder of the chamber can be opened to the external environment without exposing the space within the bellows to contamination. Once the chamber door has been closed and the chamber purged, the registration plate can again be raised to expose the space within the bellows to the remainder of the chamber. Accordingly, the space within the bellows is then safely exposed to an environment that has already been purged of contamination.

In another aspect, the present invention incorporates a gutter formed in a wall of the chamber below the registration plate. The gutter surrounds the edge of the platform and is configured to catch particulate matter, such as broken wafer particles. The gutter prevents the particulate matter from passing under the registration plate, past the seal, and into the bellows.

In another aspect, the present invention provides a method of accessing the interior of a loadlock chamber from outside the chamber. The method limits exposure of the space within the bellows to the external environment. Accordingly, the introduction of contamination into the space within the bellows is reduced.

BRIEF DESCRIPTION OF THE DRAWINGS

Referring now to the drawings in which like reference numbers represent corresponding components throughout.

DETAILED DESCRIPTION OF THE PREFERRED EMBODIMENT

Figure 1:
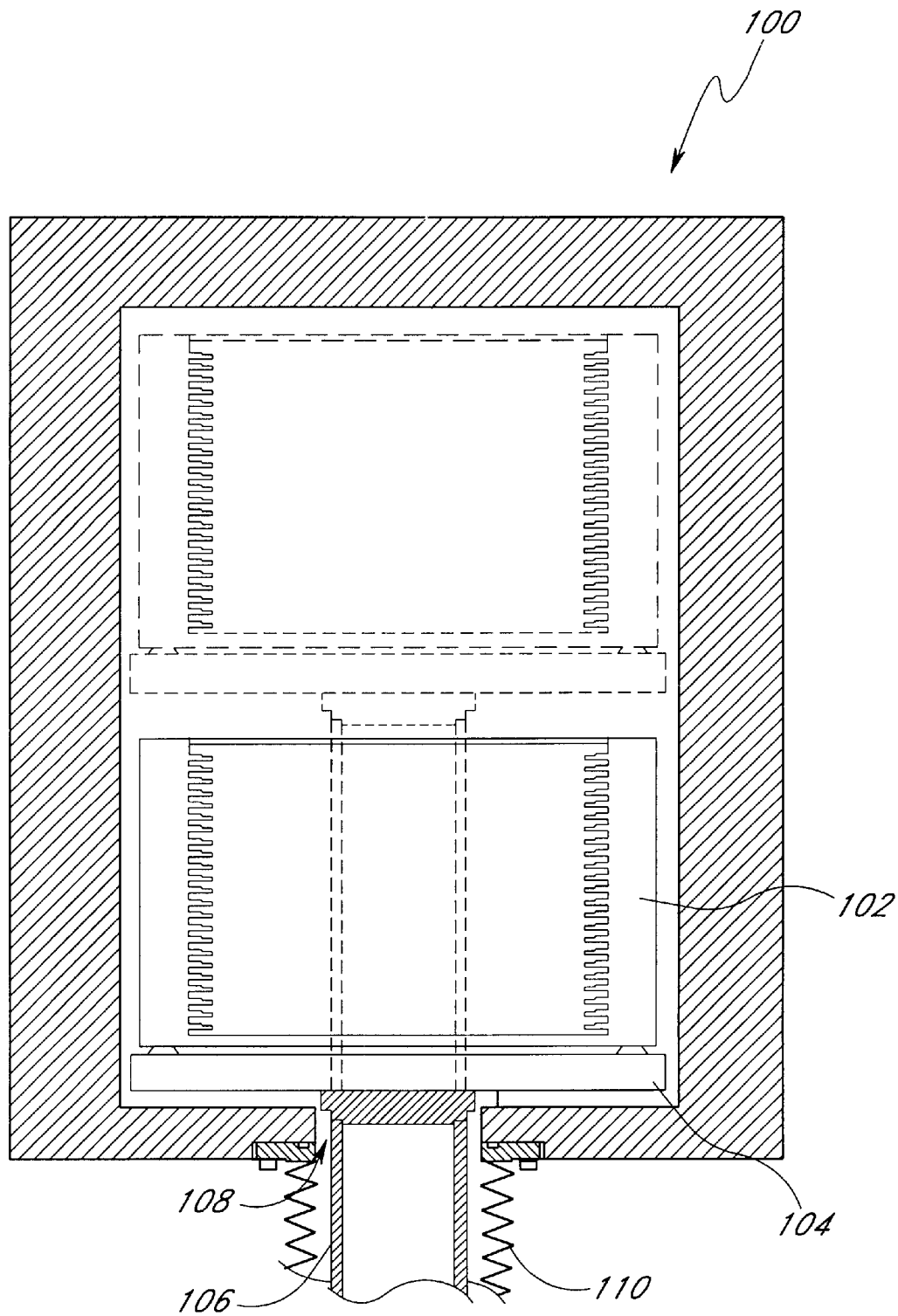
FIG. 1 illustrates a cross section of a previous design for a loadlock chamber of a semiconductor processing device.

FIG. 1 illustrates a cross section of a previous design for a loadlock chamber 100 of a semiconductor processing device. The interior of the chamber is accessible through a door (not shown). A wafer cassette 102 is positioned on an index platform or registration plate 104 mounted on a shaft 106 that extends through an aperture 108 in the wall of the chamber 100. Once the door has been shut, the chamber 100 can be purged. The shaft 106 then raises and lowers the registration plate 104 to provide access to the wafers to, for example, a robot arm (not shown). The interior volume of the chamber is protected from exposure to the outside environment by a bellows 110 that surrounds the shaft 106. FIG. 1 depicts, in phantom, the shaft 106, registration plate 104, and cassette 102 in a raised position.

Figure 2:
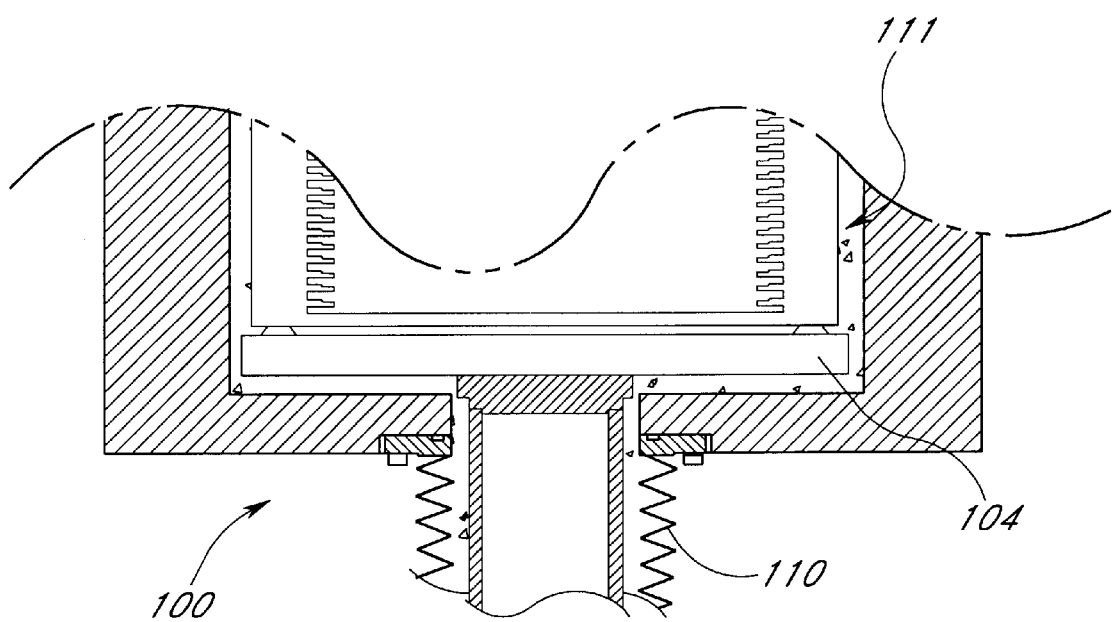
FIG. 2 illustrates a problem with the previous design in that contamination can pass into the space enveloped by the bellows.

FIG. 2 illustrates a problem with the previous design in that contamination 111 can pass from the outside environment under the registration plate 104 and into the space enveloped by the bellows 110 when the door to the chamber is open. Contamination 111 that remains above the registration plate 104 and within the upper part of the loadlock chamber 100 is less of a concern as this contamination can be easily removed during a purging process. Purging typically involves flushing the chamber 100 with a gas such as nitrogen, pumping the chamber 100 down with a vacuum pump, and/or heating the chamber 100. Contamination that passes below the registration plate 104 and into the bellows 110 area, however, cannot be easily purged. The space below the registration plate 104 is remote from the main space in the chamber 100; therefore the flow of purging gas is substantially reduced in this area. Furthermore, the folds of the bellows 110 create a substantial amount of additional surface area in which contamination can become trapped. The folds of the bellows 100 also prevent the circulation of purging gas so as to make purging more difficult. A major contaminant of concern is water vapor, which is introduced each time the internal volume of the chamber is exposed to the outside environment. Other contaminants, such as, for example, particulate matter, are also of concern.

Figure 3:
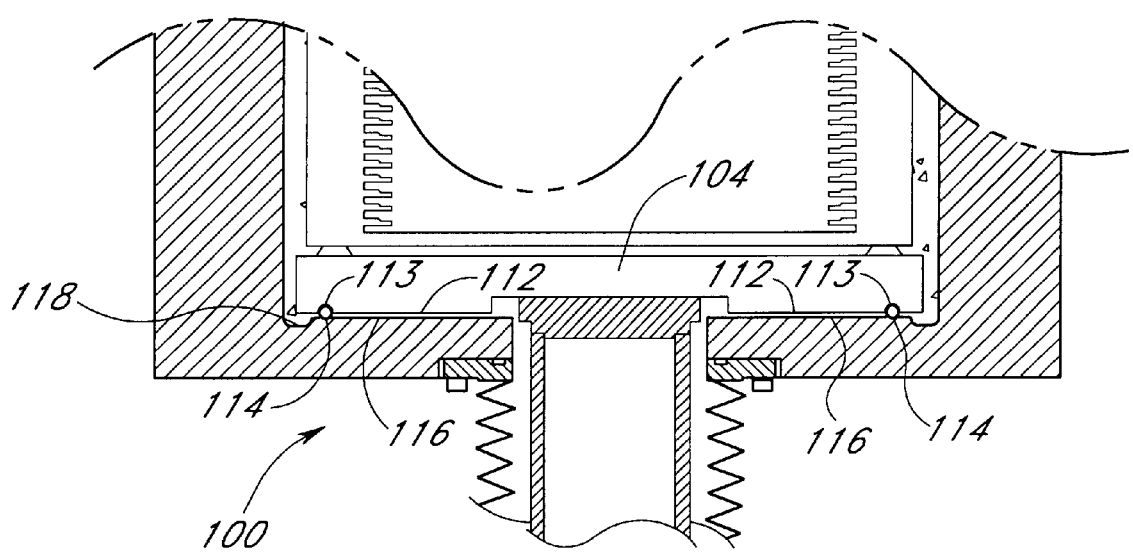
FIG. 3 illustrates a cross section of a preferred embodiment of the present invention.

FIG. 3 illustrates a preferred embodiment of the present invention. The underside or facing surface 112 of the registration plate 104 is extended to narrow the gap between the bottom of the registration plate 104 and the lower wall of the chamber 100. A seal or O-ring 114 is positioned within a groove 113 formed on the underside 112 of the registration plate 104. The seal 114 extends around the plate 104 near its perimeter. A portion of the bottom wall 116 opposite the facing surface 112 rises to form a mating surface for the seal 114. The raised portion of the bottom wall 116 also forms a gutter 118 that helps to collect large particulate matter such as broken wafer particles.

Figure 4:
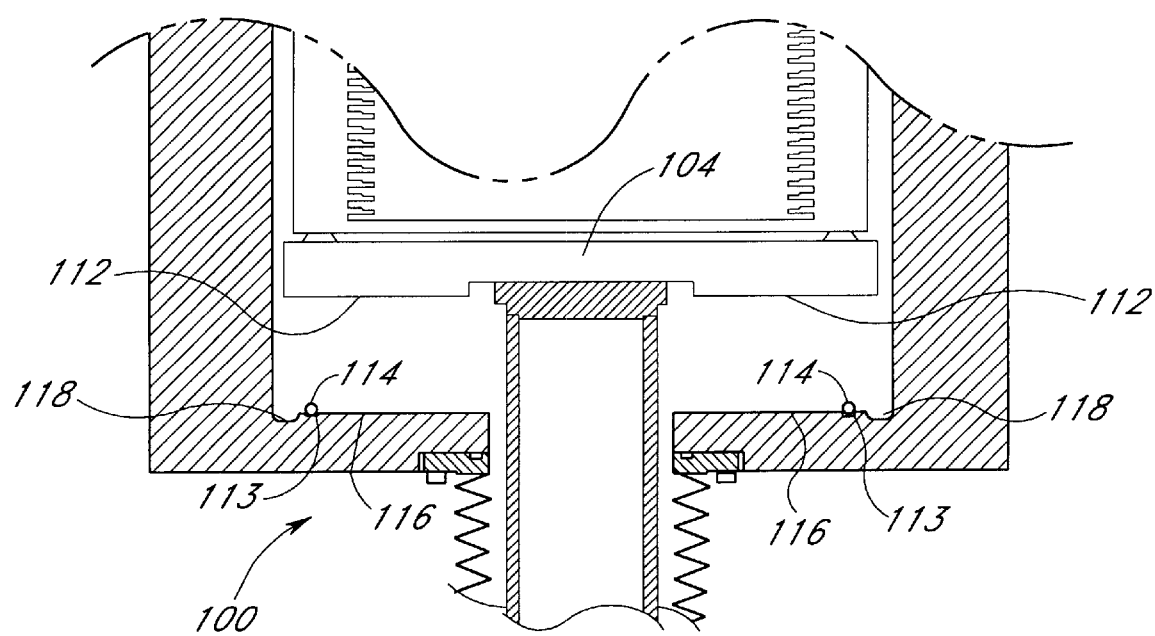
FIG. 4 illustrates a cross section of an alternative embodiment of the present invention in which a registration plate is shown in a partially raised position.

FIG. 4 illustrates one alternative embodiment in which the seal 114 is positioned within a groove 113 formed in the bottom wall 116 rather than in the registration plate 104. The registration plate 104 in FIG. 4 is shown in a partially raised position wherein the space within the bellows 110 is exposed to the chamber interior. One skilled in the art will recognize that other configurations for positioning a seal between the registration plate 104 and the bottom wall 116 could be used as well.

Figure 5:
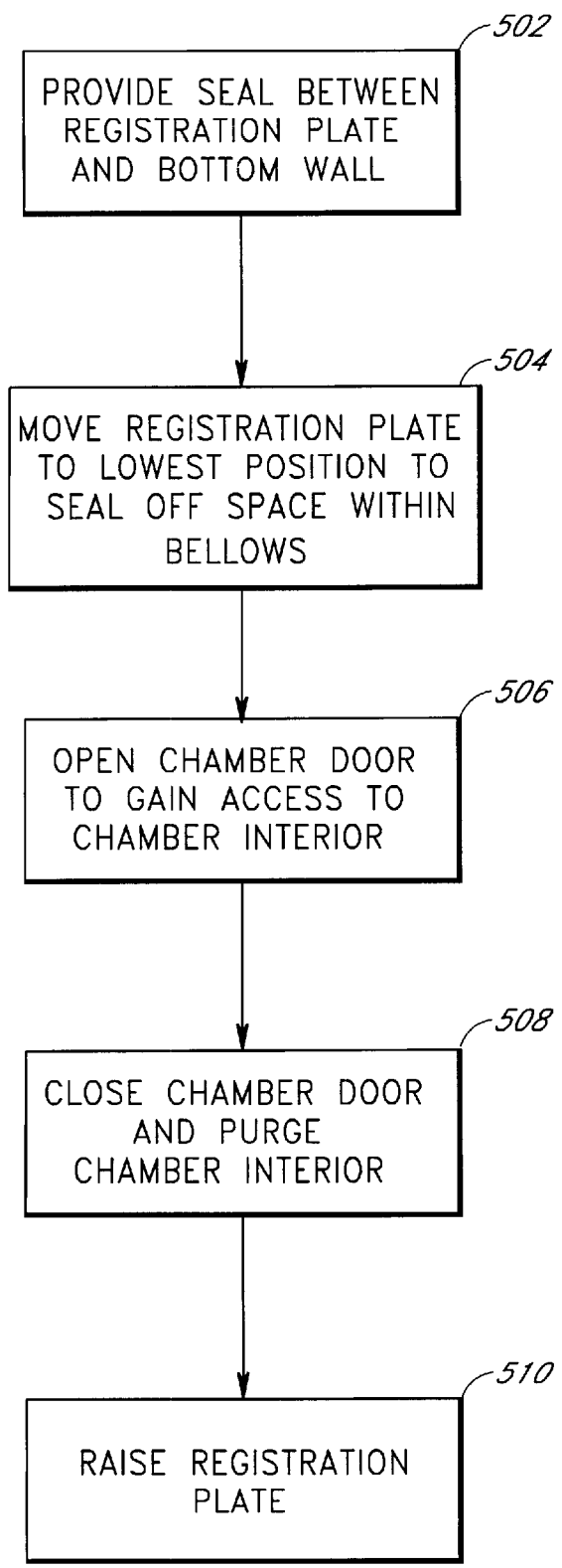
FIG. 5 illustrates a method for preventing introduction of contamination into the space within the bellows.

The method illustrated in FIG. 5 functions to prevent introduction of contamination into the space within the bellows by sealing off the space beneath the registration plate 104 and within the bellows 110 from the outside environment when the door to the chamber is opened. At a step 502, a seal 114 is provided between the registration plate 104 and the bottom wall 116. At a step 504, the registration plate 114 is moved to its lowest position so that the seal 114 mates with the raised portion of the bottom wall 116 to isolate the space beneath the registration plate 104 and within the bellows 110 from the interior of the chamber 100. Once the space beneath the registration plate 104 and within the bellows 110 has been isolated, the chamber door is opened to gain access to the interior of the chamber 100 at a step 506. At this point, the interior of the chamber 100 is safely exposed to the outside environment. Contamination of the interior of the chamber 100 is not a concern as this area can be easily purged. Once access to the chamber from the outside environment has been completed, the chamber door is shut and the chamber 100 is purged at a step 508. Next, the plate 104 can again be raised to expose the space within the bellows 110 to the remainder of the chamber 100 at a step 510. As the interior of the chamber 100 has already been purged, there is no risk of contamination flowing into or subsequently out of the space beneath the registration plate 104 and within the bellows 110.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed. It is intended that the scope of the invention be limited not by this detailed description but by the claims appended hereto.

What is claimed is:

1. A semiconductor wafer handling apparatus comprising:
   a wafer handling chamber having a chamber wall;
   an aperture formed in the chamber wall;
   a moveable shaft extending through the aperture;
   a bellows surrounding the moveable shaft outside of the chamber, wherein the bellows is attached to the chamber wall around the aperture;
   a plate, mounted to the moveable shaft and positioned within the chamber, the plate having a facing surface that faces a portion of the chamber wall surrounding the aperture, wherein the moveable shaft is configured to move the facing surface of the plate proximate the chamber wall to cover the aperture;
   a sealing member positioned to form a seal between the facing surface and the chamber wall surrounding the aperture to prevent contamination from entering the space within the bellows.

2. The apparatus of claim 1, wherein the sealing member encompasses the aperture and isolates the space within the aperture and within the bellows from the remaining space within the chamber when the facing surface is moved proximate the chamber wall.

3. The apparatus of claim 2, wherein the sealing member is disposed in a groove formed in the facing surface.

4. The apparatus of claim 2, wherein the sealing member is disposed in a groove formed in the chamber wall.

5. The apparatus of claim 2, further comprising a gutter formed in the chamber wall and encompassing the mating surface of the sealing member on the chamber wall, wherein the gutter is configured to prevent contamination from entering the space within the aperture and within the bellows.

6. A semiconductor wafer handling apparatus comprising:
   a wafer handling chamber having a chamber wall;
   an aperture formed in the chamber wall;
   a moveable shaft extending through the aperture;
   a bellows surrounding the moveable shaft outside of the chamber, wherein the bellows is attached to the chamber wall around the aperture;
   a plate, mounted to the moveable shaft and positioned within the chamber, the plate having a facing surface that faces a portion of the chamber wall surrounding the aperture, wherein the moveable shaft is configured to move the facing surface of the plate proximate the chamber wall to cover the aperture;
   a gutter formed in the chamber wall and positioned adjacent a perimeter of the plate when the plate is positioned proximate the chamber wall surrounding the aperture, the gutter configured to collect contaminants.

7. The apparatus of claim 6, wherein the gutter is configured to prevent contamination from entering the space within the aperture and within the bellows.

8. The apparatus of claim 7, further comprising a sealing member positioned to form a seal between the facing surface and the chamber wall.

9. The apparatus of claim 8, wherein the sealing member encompasses the aperture and isolates the space within the aperture and within the bellows from the remaining space within the chamber when the facing surface is moved proximate the chamber wall.

10. The apparatus of claim 9, wherein the sealing member is disposed in a groove formed in the facing surface.

11. The apparatus of claim 9, wherein the sealing member is disposed in a groove formed in the chamber wall.

12. A method of preventing contamination of a load lock chamber of a semiconductor processing device, the method comprising:
   providing a semiconductor processing device comprising:
      a load lock chamber having a chamber wall;
      an aperture formed in the chamber wall;
      a moveable shaft extending through the aperture;
      a bellows surrounding the moveable shaft outside of the chamber, wherein the bellows is attached to the chamber wall around the aperture;
      a plate, mounted to the moveable shaft and positioned within the chamber, the plate having a facing surface that faces a portion of the chamber wall surrounding the aperture, wherein the moveable shaft is configured to move the facing surface of the plate proximate the chamber wall to cover the aperture; and
      a sealing member positioned to form a seal between the facing surface and the chamber wall surrounding the aperture to prevent contamination from entering the space within the bellows;
   positioning the plate proximate the chamber wall so that the space within the aperture and within the bellows is isolated by the sealing member;
   opening the interior of the chamber to an outside atmosphere;

sealing off the interior of the chamber from the outside atmosphere;

purging the interior of the chamber to evacuate contamination; and moving the plate away from the chamber wall such that the space within the aperture and within the bellows is exposed to the remaining space in the chamber.

13. The method of claim 12, wherein the sealing member encompasses the aperture and isolates the space within the aperture and within the bellows from the remaining space within the chamber when the facing surface is moved proximate the chamber wall.

14. The method of claim 13, wherein the sealing member is disposed in a groove formed in the facing surface.

15. The method of claim 13, wherein the sealing member is disposed in a groove formed in the chamber wall.

16. The method of claim 13, wherein the semiconductor device further comprises a gutter formed in the chamber wall and encompassing the mating surface of the sealing member on the chamber wall and wherein the gutter is configured to prevent contamination from entering the space within the aperture and within the bellows.

* * * * *